United States Patent
Lee et al.

(10) Patent No.: US 9,177,788 B2
(45) Date of Patent: Nov. 3, 2015

(54) PLASMA REACTOR WITH CONDUCTIVE MEMBER IN REACTION CHAMBER FOR SHIELDING SUBSTRATE FROM UNDESIRABLE IRRADIATION

(71) Applicant: Synos Technology, Inc., Fremont, CA (US)

(72) Inventors: Sang In Lee, Sunnyvale, CA (US); Ilsong Lee, San Jose, CA (US); Hyo Seok Yang, Cupertino, CA (US)

(73) Assignee: Veeco ALD Inc., Fremont, CA (US)

( * ) Notice: Subject to any disclaimer, the term of this patent is extended or adjusted under 35 U.S.C. 154(b) by 116 days.

(21) Appl. No.: 13/773,222

(22) Filed: Feb. 21, 2013

(65) Prior Publication Data
US 2013/0237065 A1    Sep. 12, 2013

Related U.S. Application Data
(60) Provisional application No. 61/609,836, filed on Mar. 12, 2012.

(51) Int. Cl.
| | |
|---|---|
| *H01L 21/02* | (2006.01) |
| *C23C 16/30* | (2006.01) |
| *C23C 16/34* | (2006.01) |
| *C23C 16/40* | (2006.01) |
| *C23C 16/455* | (2006.01) |
| *H01J 37/32* | (2006.01) |

(52) U.S. Cl.
CPC ........ *H01L 21/02274* (2013.01); *C23C 16/308* (2013.01); *C23C 16/345* (2013.01); *C23C 16/402* (2013.01); *C23C 16/45536* (2013.01); *C23C 16/45544* (2013.01); *C23C 16/45551* (2013.01); *C23C 16/45591* (2013.01); *H01J 37/32357* (2013.01); *H01J 37/32623* (2013.01); *H01L 21/0228* (2013.01); *H01L 21/02178* (2013.01)

(58) Field of Classification Search
USPC ...................... 118/723 R; 438/766
See application file for complete search history.

(56) References Cited

U.S. PATENT DOCUMENTS

| | | |
|---|---|---|
| 3,046,936 A | 7/1962 | Simons, Jr. |
| 4,138,306 A | 2/1979 | Niwa |
| 5,844,195 A | 12/1998 | Fairbairn et al. |

(Continued)

FOREIGN PATENT DOCUMENTS

| | | |
|---|---|---|
| JP | 08-31803 | 2/1996 |
| JP | H08-31803 A | 2/1996 |

(Continued)

OTHER PUBLICATIONS

PCT International Search Report and Written Opinion, PCT Application No. PCT/US2013/027414, Apr. 26, 2013, 12 pages.

(Continued)

*Primary Examiner* — Alexander Ghyka
(74) *Attorney, Agent, or Firm* — Fenwick & West LLP

(57) ABSTRACT

Placing a conductive member between a plasma chamber in a remote plasma reactor and a substrate to shield the substrate from irradiation of undesirable electromagnetic radiation, ions or electrons. The conductive member blocks the electromagnetic radiation, neutralizes ions and absorbs the electrons. Radicals generated in the plasma chambers flows to the substrate despite the placement of the conductive member. In this way, the substrate is exposed to the radicals whereas damages to the substrate due to electromagnetic radiations, ions or electrons are reduced or removed.

19 Claims, 5 Drawing Sheets

(56) References Cited

U.S. PATENT DOCUMENTS

| | | | |
|---|---|---|---|
| 2001/0029894 A1* | 10/2001 | DeOrnellas et al. | 118/723 R |
| 2002/0073925 A1 | 6/2002 | Noble et al. | |
| 2002/0112819 A1 | 8/2002 | Kamarehi et al. | |
| 2003/0124846 A1 | 7/2003 | Chiang et al. | |

FOREIGN PATENT DOCUMENTS

| | | |
|---|---|---|
| JP | 08-97155 A | 4/1996 |
| JP | 2006-277953 | 10/2006 |
| JP | 2011-096616 A | 5/2011 |

OTHER PUBLICATIONS

Korean Office Action, Korean Application No. 10-2013-7008694, Jul. 28, 2014, 15 pages.

Korean Office Action, Korean Application No. 10-2013-7008694, Jan. 19, 2015, 18 pages.

Korean Office Action, Korean Application No. 10-2013-7008694, Jul. 20, 2015, 5 pages (with concise explanation of relevance).

* cited by examiner

PLASMA REACTOR WITH CONDUCTIVE MEMBER IN REACTION CHAMBER FOR SHIELDING SUBSTRATE FROM UNDESIRABLE IRRADIATION

CROSS-REFERENCE TO RELATED APPLICATION

This application claims priority under 35 U.S.C. §119(e) to U.S. Provisional Patent Application No. 61/609,836, filed on Mar. 12, 2012, which is incorporated by reference herein in its entirety.

BACKGROUND

1. Field of Art

The present invention relates to a plasma reactor used for treating surface of a substrate or depositing one or more layers of materials on a substrate.

2. Description of the Related Art

Plasma is partially ionized gas consisting of large concentrations of excited atomic, molecular, ionic, and free-radical species. The radicals generated by plasma can be used for various purposes, including (i) chemically or physically modifying the characteristics of a surface of a substrate by exposing the surface to the reactive species or radicals, (ii) performing chemical vapor deposition (CVD) by causing reaction of the reactive species or radicals and source precursor in a vacuum chamber, and (iii) performing atomic layer deposition (ALD) by exposing a substrate adsorbed with source precursor molecules to the reactive species or radicals.

There are two types of plasma reactors: (i) a direct plasma reactor, and (ii) a remote plasma reactor. The direct plasma reactor generates plasma that comes into contact directly with the substrate. The direct plasma reactor may generate energetic particles (e.g., free radicals, electrons and ions) and radiation that directly contact the substrate. Such contact may cause damage to the surface of the substrate and also disassociate source precursor molecules adsorbed in the substrate. Hence, the direct plasma reactor has limited use in fabrication of semiconductor devices or organic light emitting diode (OLED) devices.

A remote plasma device generates plasma at a location remote from the substrate. When generating the plasma, other undesirable irradiation of electrons, ultraviolet ray or ions may also result from the plasma. The substrate may be exposed to such irradiation and cause damage to the substrate or make undesirable changes to the properties of the substrate.

SUMMARY

Embodiments relate to treating a surface of a substrate or depositing a layer of material on a substrate by injecting radicals generated by plasma onto the substrate while shielding the substrate from undesirable irradiation using a conductive member. A gas is injected into a plasma chamber formed in a plasma reactor to generate radicals. The radicals generated in the plasma reactor are injected onto the substrate via a perforation and a reaction chamber formed in the plasma reactor. The conductive member is placed between the perforation and the substrate to shield the substrate from the undesirable irradiation by blocking straight linear paths between the plasma chamber and the substrate.

In one embodiment, the plasma chamber is defined by electrodes for generating the plasma in the plasma chamber. A voltage signal is applied across the electrodes to generate the radicals.

In one embodiment, the substrate is moved to inject radicals to another portion of the substrate.

In one embodiment, the conductive member is connected to ground via a body of the plasma reactor.

In one embodiment, the plasma reactor is formed with a channel to convey the gas to the plasma chamber.

In one embodiment, excess radicals or gas is discharged via a passage formed between a side of the reaction chamber and an exhaust port formed in the plasma reactor.

In one embodiment, a distance from the substrate to a ceiling of the passage is less than ⅔ of a width of the reaction chamber and is less than ⅔ of a distance from the substrate to the perforation.

In one embodiment, the conductive member has a curved and smooth surface. The conductive member may have a circular cross-sectional shape.

In one embodiment, the conductor member is formed with a channel for injecting another gas into the reaction chamber.

Embodiment also relate to a plasma reactor including a body, an electrode and a conductive member. The body is formed with a plasma chamber, a reaction chamber and a perforation between the plasma chamber and the reaction chamber. Radicals generated in the plasma chamber by plasma travel to the reaction chamber via the perforation. A portion of the substrate passing by the reaction chamber is injected with the radicals. The electrode placed within the reaction chamber generates plasma within the plasma chamber by applying a voltage signal to the electrode. A conductive member placed between the substrate and the perforation shield the substrate from undesirable irradiation generated in the plasma chamber.

In one embodiment, the width of the conductive member is equal to or larger than the width of the perforation.

DETAILED DESCRIPTION OF EMBODIMENTS

Figure 1:
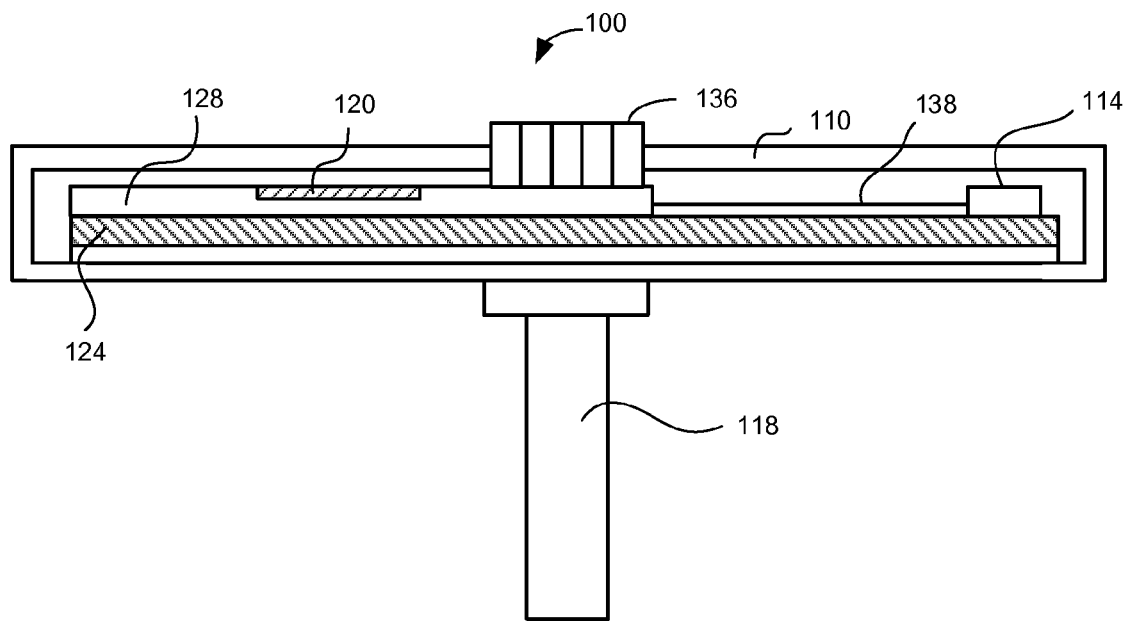
FIG. 1 is a cross sectional diagram of a linear deposition device, according to one embodiment.

Embodiments are described herein with reference to the accompanying drawings. Principles disclosed herein may, however, be embodied in many different forms and should not be construed as being limited to the embodiments set forth herein. In the description, details of well-known features and techniques may be omitted to avoid unnecessarily obscuring the features of the embodiments.

In the drawings, like reference numerals in the drawings denote like elements. The shape, size and regions, and the like, of the drawing may be exaggerated for clarity.

Embodiments relate to placing a conductive member between a plasma chamber in a remote plasma reactor and a substrate to shield the substrate from irradiation of undesirable electromagnetic radiation, ions or electrons. The conductive member blocks the electromagnetic ray, neutralizes ions and absorbs the electrons. Radicals generated in the plasma chambers flow to the substrate despite the placement of the conductive member. In this way, the substrate is exposed to the radicals whereas damages to the substrate due to electromagnetic radiations, ions or electrons are reduced or removed.

Figure 2:
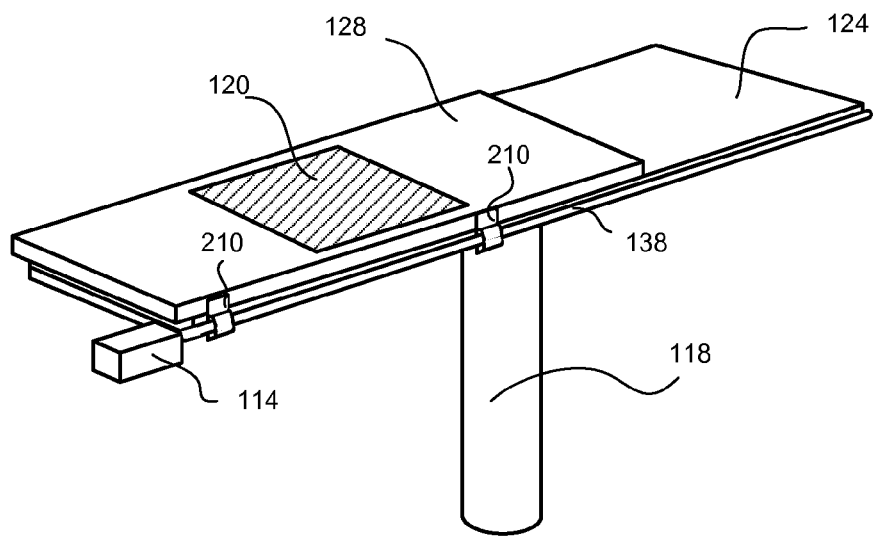
FIG. 2 is a perspective view of a linear deposition device, according to one embodiment.

FIG. 1 is a cross sectional diagram of a linear deposition device 100, according to one embodiment. FIG. 2 is a perspective view of the linear deposition device 100 (without chamber walls to facilitate explanation), according to one embodiment. The linear deposition device 100 may include, among other components, a support pillar 118, the process chamber 110 and one or more reactors 136. The reactors 136 may include one or more of injectors and plasma reactors. Each of the injectors injects source precursors, reactant precursors, purge gases or a combination of these materials onto the substrate 120. Each of the plasma reactors generates radicals and injects radicals onto the substrate 120.

The process chamber enclosed by the walls may be maintained in a vacuum state to prevent contaminants from affecting the deposition process. The process chamber 110 contains a susceptor 128 which receives a substrate 120. The susceptor 128 is placed on a support plate 124 for a sliding movement. The support plate 124 may include a temperature controller (e.g., a heater or a cooler) to control the temperature of the substrate 120. The linear deposition device 100 may also include lift pins that facilitate loading of the substrate 120 onto the susceptor 128 or dismounting of the substrate 120 from the susceptor 128.

In one embodiment, the susceptor 128 is secured to brackets 210 that move across an extended bar 138 with screws formed thereon. The brackets 210 have corresponding screws formed in their holes receiving the extended bar 138. The extended bar 138 is secured to a spindle of a motor 114, and hence, the extended bar 138 rotates as the spindle of the motor 114 rotates. The rotation of the extended bar 138 causes the brackets 210 (and therefore the susceptor 128) to make a linear movement on the support plate 124. By controlling the speed and rotation direction of the motor 114, the speed and direction of the linear movement of the susceptor 128 can be controlled. The use of a motor 114 and the extended bar 138 is merely an example of a mechanism for moving the susceptor 128. Various other ways of moving the susceptor 128 (e.g., use of gears and pinion at the bottom, top or side of the susceptor 128). Moreover, instead of moving the susceptor 128, the susceptor 128 may remain stationary and the reactors 136 may be moved.

Figure 3:
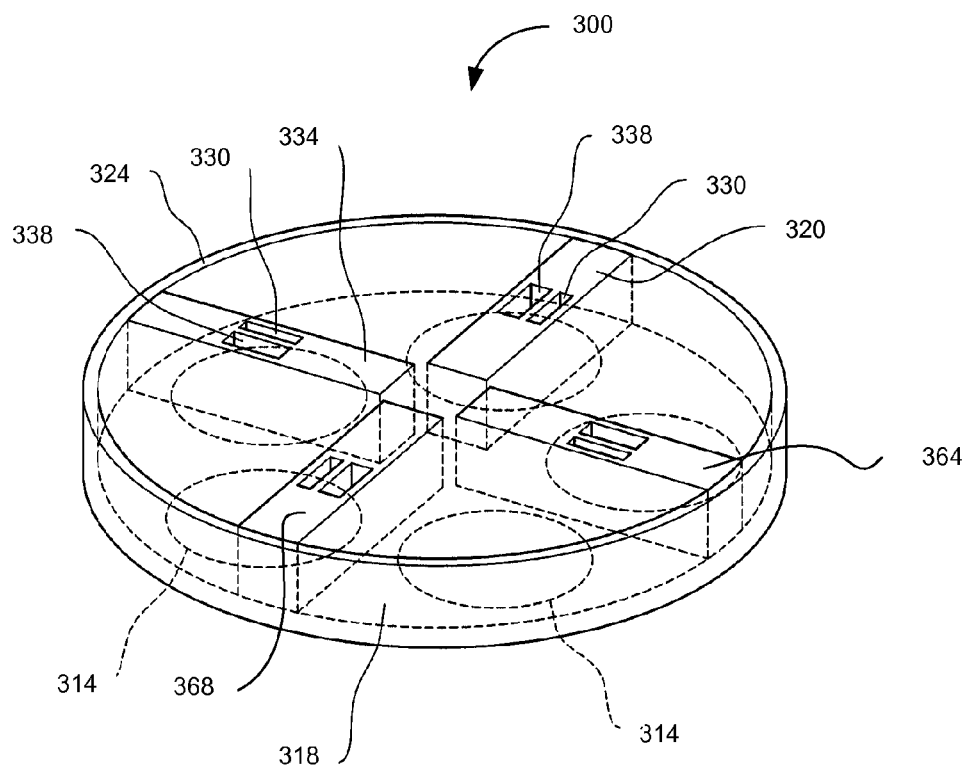
FIG. 3 is a perspective view of a rotating deposition device, according to one embodiment.

FIG. 3 is a perspective view of a rotating deposition device 300, according to one embodiment. Instead of using the linear deposition device 100 of FIG. 1, the rotating deposition device 300 may be used to perform the deposition process according to another embodiment. The rotating deposition device 300 may include, among other components, reactors 320, 334, 364, 368, a susceptor 318, and a container 324 enclosing these components. The susceptor 318 secures the substrates 314 in place. The reactors 320, 334, 364, 368 are placed above the substrates 314 and the susceptor 318. Either the susceptor 318 or the reactors 320, 334, 364, 368 rotate to subject the substrates 314 to different processes.

One or more of the reactors 320, 334, 364, 368 are connected to gas pipes (not shown) to provide source precursor, reactor precursor, purge gas and/or other materials. The materials provided by the gas pipes may be (i) injected onto the substrate 314 directly by the reactors 320, 334, 364, 368, (ii) after mixing in a chamber inside the reactors 320, 334, 364, 368, or (iii) after conversion into radicals by plasma generated within the reactors 320, 334, 364, 368. After the materials are injected onto the substrate 314, the redundant materials may be exhausted through outlets 330, 338.

Embodiments as described herein may be use in the linear deposition device 100, the rotating deposition device 300 or other types of deposition devices. Taking the examples of the linear deposition device 100 and the rotating deposition device 300, the substrate 120 (or 314) may undergo different sequences of processes by moving the substrate 120 (or 314) relative to the reactors in one direction and then in an opposite direction.

Figure 4:
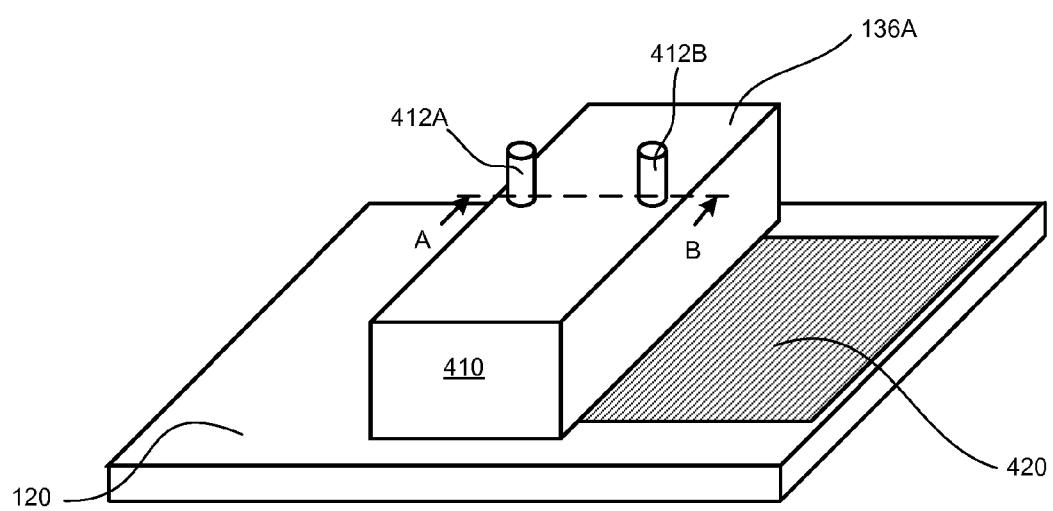
FIG. 4 is a perspective view of a plasma reactor according to one embodiment.

FIG. 4 is a diagram illustrating a plasma reactor 136A according to one embodiment. The plasma reactor 136A has a body 410 that is connected to discharge pipes 412A, 412B. A channel, holes or slits, a plasma chamber, and a reactor chamber are formed in the body 410 to inject gas, and a voltage signal is applied to generate radicals of the injected gas. The channel, the plasma chamber and the reaction chamber extend lengthwise across the plasma reactor 136A. The plasma chamber is defined by electrodes and provided with the gas. By applying a voltage signal across the electrodes, radicals are generated within the plasma chamber 136A. The generated radicals generated in the plasma chamber are injected onto the substrate 120 via the reaction chamber placed above the substrate 120, as described in detail below with reference to FIG. 5A.

The plasma reactor 136A includes mechanisms for discharging excess gas and excess radicals, as described below in detail with reference to FIG. 5A. The excess gas may include molecules that are not excited into radicals by the plasma reactor as well as radicals that have reverted back to an inactive state as the radicals move through the plasma reactor 136A.

In one embodiment, the plasma reactor 136A generates radicals that function as precursor for performing atomic layer deposition (ALD) on the substrate 420. Alternatively, the radicals may function to treat the surface of the substrate 420 for enhancing a subsequent deposition process.

In one embodiment, the substrate 120 is moved horizontally (e.g., to the right or the left in FIG. 4) to inject radicals to different parts of the substrate 120. Alternatively, the plasma reactor 136A is moved horizontally (instead of the substrate 120) to expose different parts of the substrate 120 to the radicals.

Figure 5A:
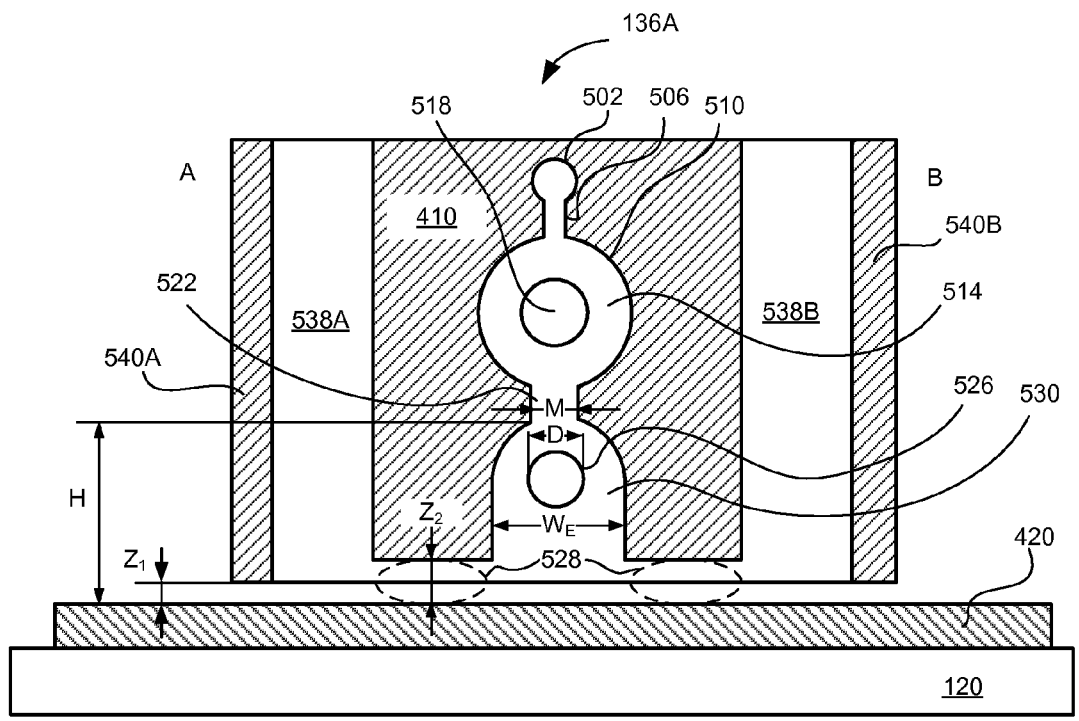
FIG. 5A is a cross sectional diagram illustrating the plasma reactor taken along line A-B of FIG. 4, according to one embodiment.

FIG. 5A is a cross sectional diagram illustrating the plasma reactor 136A taken along line A-B of FIG. 4, according to one embodiment. In the body 410 of the plasma reactor 136A, exhaust ports 538A, 538B, gas channel 502, slits or holes 506, a radical chamber 514, a reaction chamber 530, and perforations 522 are formed. In one embodiment, the gas is injected into the radical chamber 514 via the gas channel 502 and slits/holes 506. The gas injected into the plasma reactor may consist of a single type or gas or the gas may include multiple types of gases. An outer electrode 510 and an inner electrode 518 define the radical chamber 514.

The gap between outer side walls 540A, 540B of the body 410 and the substrate 420 is $Z_1$. In one embodiment, $Z_1$ is in the range of 0.5 mm to 3 mm. The distance from the substrate 420 to the ceilings of passages 528 is $Z_2$.

A voltage signal is applied across the outer electrode 510 and the inner electrode 518 to generate plasma within the radical chamber 514. In one embodiment, the outer electrode 510 is part of the body 410 that is connected to ground or a voltage source. As a result of applying the voltage signal, radicals of the gas as well as irradiation of electromagnetic ray (e.g., ultraviolet ray), ions or electrons are generated within the radical chamber 514.

The exposure of substrate 420 to the electromagnetic ray (e.g., ultraviolet ray) may cause undesirable changes in the substrate. For example, when forming a transistor on the substrate, the exposure of the substrate to ultraviolet ray may cause shift in the threshold voltage ($V_{th}$) of the transistor or degrading of carrier mobility in the substrate due to increased roughness of the surface or deteriorated interface characteristics. Further, devices used in organic light emitting diode (OLED), organic thin film such as Langmuir-Blodgett (LB) film or devices including such film may experience changes in the molecular structure of the organic material or disassociation of such organic material as a result of exposure to the ultraviolet ray. Ions and electrons may also negatively affect the substrate by causing a charge-up phenomenon or knock-on effect due to bombardment of these on the surface of the substrate. Hence, it is advantageous to shield the substrate from the electromagnetic ray, ions and electrons generated in the plasma chamber 514.

The radicals as well as the electromagnetic ray, ions or electrons enter the reaction chamber 530 via the perforation 522 having a width M. A cylindrical rod 530 is placed in the reaction chamber 530 between the perforation 522 and the substrate 420. The cylindrical rod 530 blocks the electromagnetic ray (e.g., ultraviolet ray), neutralizes the ions and absorbs electrons passing the perforation 522. For this purpose, the cylindrical rod 530 may be connected to ground (for example, via the body 410). On the other hand, the radicals pass both sides of the cylindrical rod 530 and move down to the surface of the substrate 420. Then the radicals react with the surface of the substrate 420 to deposit material or treat the surface of the substrate 420.

The cylindrical rod 530 has a diameter D sufficient to shield the substrate 420 below the cylindrical rod 530. Diameter D is preferably larger than width M of the perforation 522 such that the electromagnetic ray generated in the radical chamber 514 is blocked by the cylindrical rod 530. However, diameter D is sufficiently smaller than width $W_E$ of reaction chamber 530 such that the radicals may stream down to the substrate 420 between the cylindrical rod 530 and the side walls of the reaction chamber 530 without significant blockage of flow of the radicals. The cylindrical rod 526 may be located at a vertical location with the reaction chamber 530 where the cylindrical rod 526 does not completely block the flow of radicals from the perforation 522. The cylindrical rod 530 may be made of electrically conductive material such as metal (e.g., stainless steel).

Further, the cylindrical rod 530 may have sufficient rigidity so that the cylindrical rod 530 may remain suspended in the reaction chamber 530 by securing both ends of the cylindrical rod 530 to the body 410.

Radicals and injected gas remaining after coming into contact with the substrate 420 below the reaction chamber 530 move through the passages 528 formed between the reaction chamber 530 and exhaust ports 538A, 538B at both sides of the body 410. The radicals or gas in the exhaust ports 538A, 538B are discharged via the discharge pipes 412A, 412B.

In one or more embodiments, the height $Z_2$ of the passages 528 is less than ⅔ of the distance H from the substrate to the perforation 522. The distance H may be 80 mm or less to ensure that an appropriate amount of radicals travel to the substrate 420 without reverting back to an inactive state. Further, the height Z2 of the passages 528 is less than ⅔ of the width $W_E$ of the reaction chamber 530. Such configuration of the passages 528 is advantageous, among other reasons, because the velocity and/or pressure of gas and the radicals may be dynamically controlled by Venturi effect.

The cylindrical shape of the rod 530 is advantageous, among other reasons, because the curved surface of the rod 530 enables the radicals injected from the perforations 522 to flow smoothly to the substrate 420 without excessive blockage. Rods having other cross-sectional profile such as square shape, elliptic shape or other various geometric shapes may also be used.

Figure 5B:
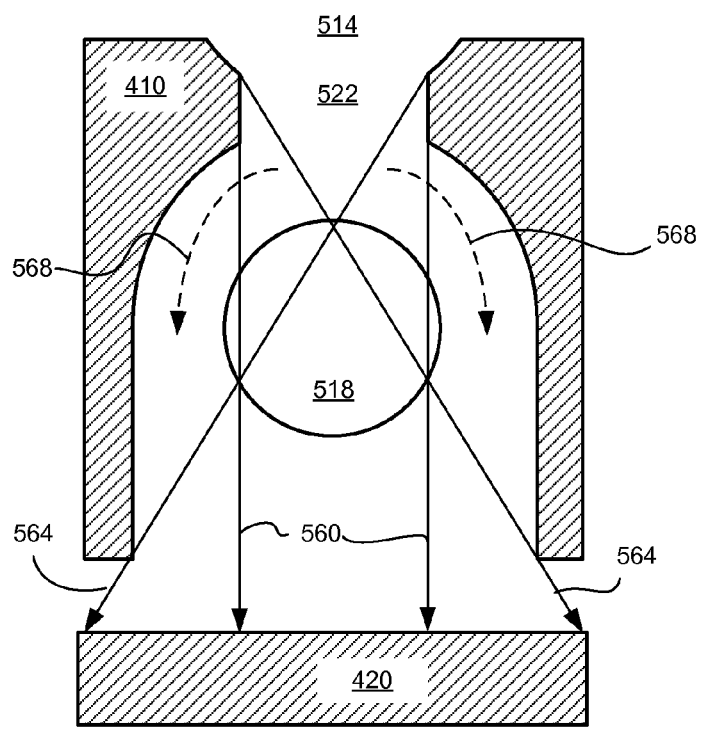
FIG. 5B is an enlarged diagram of the plasma reactor to illustrate linear paths between a radical chamber and a substrate blocked by a conductive rod, according to one embodiment.

FIG. 5B is an enlarged diagram of the plasma reactor 136A to illustrate linear paths 560, 564 between the radical chamber 514 and the substrate 420 blocked by the conductive rod 518, according to one embodiment. Radicals as well as undesirable irradiation are generated in the radical chamber 514. Since the irradiation travels in straight lineal paths, paths 564 and paths 560 in FIG. 5B represent extreme end paths that can be taken by irradiation to reach the substrate 420. These paths 564, 560 are blocked completely by the conductive rod 518. Other paths that the irradiation can take to reach the substrate 420 from the radical chamber 514 lie between these extreme paths 564, 650, and therefore, these paths are also blocked completely by the conductive rod 518.

In contrast, the radicals need not take a straight linear path to reach the substrate 420. That is, the radicals may take non-linear paths 568 between the body 410 and the conductive rod 518 to reach the substrate and the passages 528. Therefore, radicals can reach the substrate 420 despite the presence of the conductive rod 518.

Figure 6:
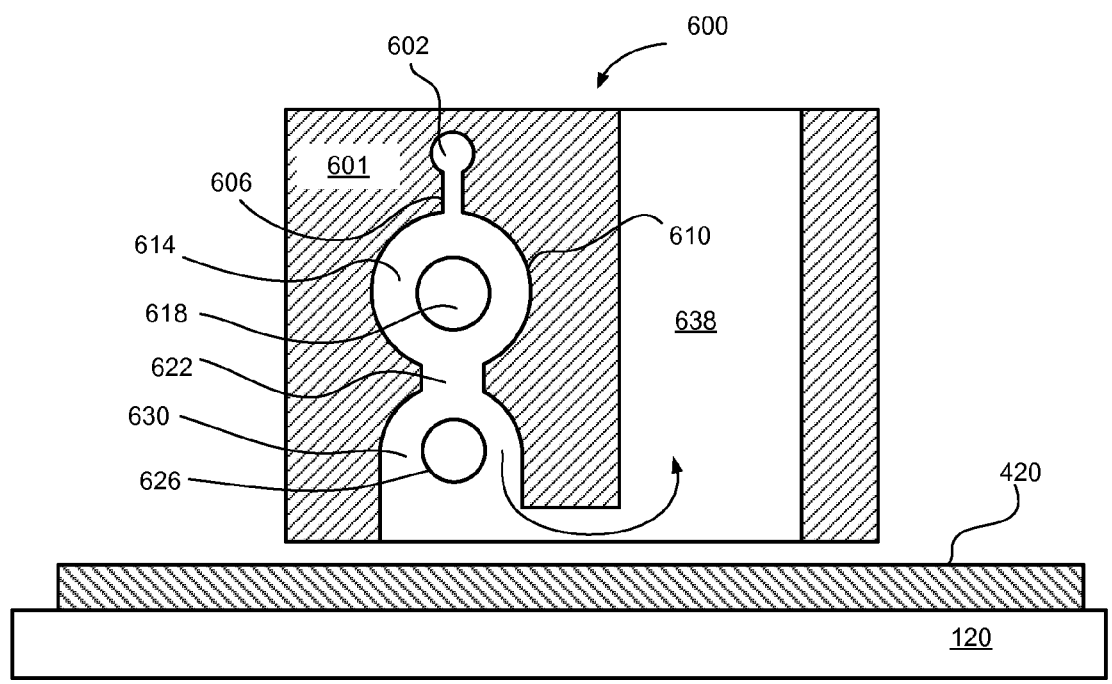
FIG. 6 is a cross sectional diagram illustrating a plasma reactor according to another embodiment.

FIG. 6 is a cross sectional diagram illustrating a plasma reactor 600 according to another embodiment. The plasma reactor 600 is different from the plasma reactor 136A in that an exhaust port 638 is formed only at one side of the body 601. The remaining structure of the plasma reactor 600 is substantially the same as the plasma reactor 136A.

In the body 601 of the plasma reactor 600, the exhaust port 638, gas channel 602, slits or holes 606, a radical chamber 614, a reaction chamber 630, and perforations 622 are formed. In one embodiment, gas is injected into the radical chamber 614 via the gas channel 602 and slits/holes 606. An outer electrode 610 and an inner electrode 618 define the radical chamber 614.

A conducting rod 626 is placed in the reaction chamber 614 between the perforations 622 and the substrate 420. The conducting rod 626 has the same function as the conducting rod 526, described above in detail with reference to FIG. 5A.

Plasma reactors may have configurations different from embodiments of FIGS. 5 and 6. For example, (i) the gas may be injected into the plasma chamber via more than one gas channels or routes, (ii) a plasma reactor may have a body formed with more than one plasma chambers or (iii) the reaction chamber may have other shapes such as a square shape or an elliptic shape.

Figure 7:
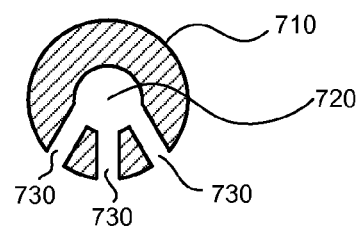
FIG. 7 is a cross sectional diagram of a conductive rod formed with a channel and holes for carrying gas, according to one embodiment.

The conducting rod may perform an additional function of conveying gas to the reaction chamber. FIG. 7 is a cross sectional diagram of a conducting rod 710 with a channel 720 and holes 730 for carrying gas, according to one embodiment. The gas injected into the conducting rod may be precursor or purge gas for depositing material using, for example, ALD, CVD or molecular vapor deposition (MVD). By injecting the gas into the reaction chamber of the plasma reactor via the channel 720 in the conducting rod 710, the structure of the body of the plasma reactor is simplified since a separate channel to inject the gas into the reaction chamber need not be formed in the body of the plasma reactor. Further, cleaning gas such as $CF_4$ and $NF_3$ may be injected via the channel 720 in the conducting rod 710 to perform a cleaning procedure after deposition of the material on the substrate 420. Source reactant such as $SiH_4$ may also be injected via the channel 720 to deposit $SiO_2$ or SiN films on the substrate 420 or dope the substrate.

Figure 8:
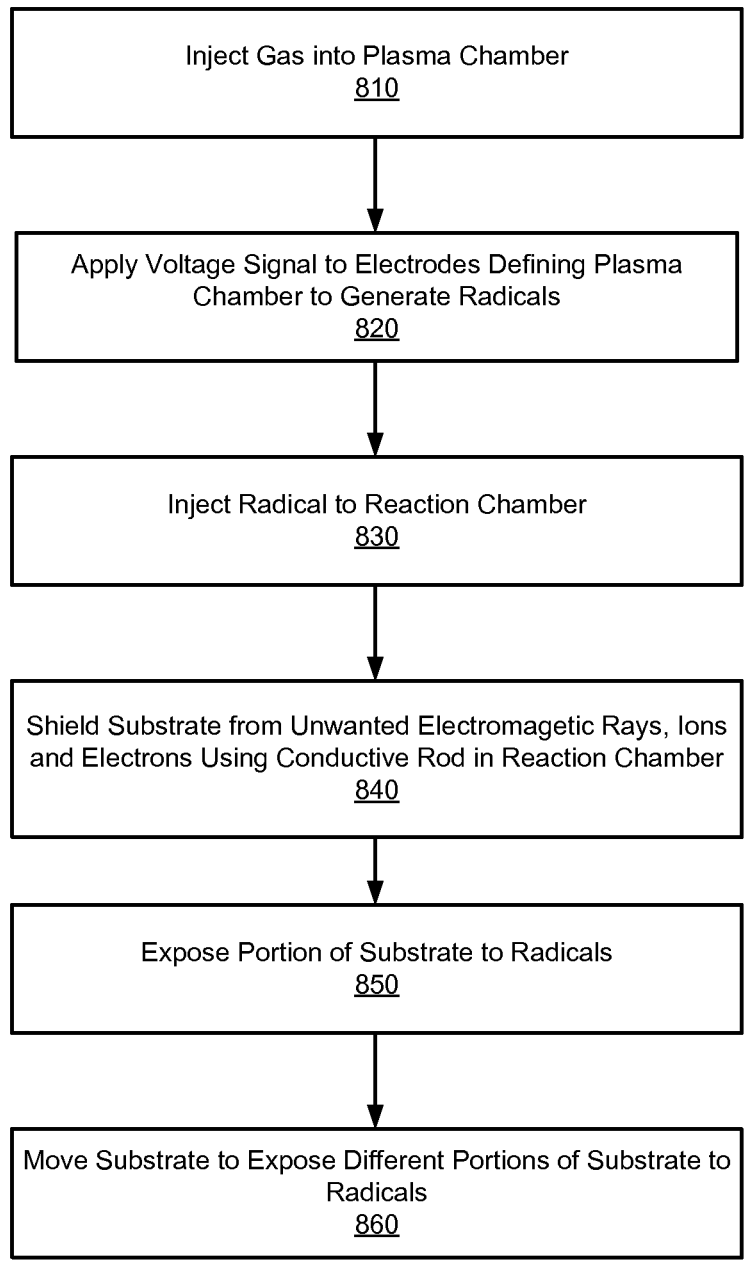
FIG. 8 is a flowchart illustrating a process of exposing a substrate to radicals while shielding the substrate from undesirable irradiation, according to one embodiment.

FIG. 8 is a flowchart illustrating a process of exposing a substrate to radicals while shielding the substrate from undesirable irradiation, according to one embodiment. First, a gas is injected 810 into a plasma chamber via a channel and slits or holes in the body of the plasma reactor. Then a voltage signal is applied 820 to electrodes defining the plasma chamber to generate radicals. During the generation of radicals, electromagnetic ray, ions or electrons that may negatively affect the substrate are also generated.

The generated radicals are injected 830 into a reaction chamber of the plasma reactor. The electromagnetic ray, ions or electrons may also enter the reaction chamber. In order to prevent such undesirable electromagnetic ray, ions or electrons from affecting the substrate, the substrate is shielded 840 using a conductive rod placed between the plasma chamber and the substrate. The conductive rod blocks the electromagnetic ray from the substrate, neutralizes ions coming into the vicinity of the conductive rod and absorbs electrons.

A portion of the substrate is exposed 850 to the radicals below the reaction chamber while reducing or eliminating exposure of the substrate to the undesirable electromagnetic rays, ions or electrons. After exposing the portion of the substrate to the radicals, the substrate is moved 860 to expose different portions of the substrate to radicals.

In one embodiment, a plasma reactor according to embodiments is use for depositing one or more layers of aluminum oxynitride (AlON) on the substrate. The substrate is first injected with Trimethylaluminum (TMA) by an injector. Then, the plasma reactor is provided with a gas including 50% of $N_2O$ and 50% of $NH_3$. The plasma reactor generates N* radicals O* radicals, and injects these radicals onto the substrate to deposit a layer of AlON. The process of injecting TMA and radicals may be repeated to deposit multiple layers of AlON.

In one or more embodiments, plasma and radicals are generated by mechanisms other than electrodes. For example, magnetrons may be used to generate microwaves to generate the plasma and the radicals. Undesirable irradiation is also generated by such different mechanisms for generating the plasma and radicals. Therefore, the same principle of shielding the substrate from undesirable irradiation is applicable to generation of plasma and radicals using microwaves or other mechanisms.

Although the present invention has been described above with respect to several embodiments, various modifications can be made within the scope of the present invention. Accordingly, the disclosure of the present invention is intended to be illustrative, but not limiting, of the scope of the invention, which is set forth in the following claims.

What is claimed is:

1. A method of treating a surface of a substrate or depositing a layer of material on a substrate, comprising:
    injecting a first gas into a plasma chamber of a plasma reactor to generate radicals by plasma;
    injecting the generated radicals into a reaction chamber of the plasma reactor via at least one perforation between the reaction chamber and the plasma chamber;
    shielding the substrate from undesirable irradiation generated in the plasma chamber using an electrically conductive member placed between the at least one perforation and the substrate, the electrically conductive member configured to block straight linear paths between the plasma chamber and the substrate;
    injecting, via a channel formed in the electrically conductive member, a second gas into the reaction chamber; and
    injecting the radicals to a portion of the substrate passing the reaction chamber.

2. The method of claim 1, further comprising moving the substrate to inject radicals to another portion of the substrate.

3. The method of claim 1, further comprising connecting the electrically conductive member to ground.

4. The method of claim 1, further comprising applying a voltage signal across electrodes defining the plasma chamber.

5. The method of claim 1, further comprising conveying the first gas to the plasma chamber via a channel formed in the plasma reactor.

6. The method of claim 1, further comprising discharging excess radicals or gas via at least a passage formed between a side of the reaction chamber and an exhaust port formed in the plasma reactor.

7. The method of claim 6, wherein a distance from the substrate to a ceiling of the passage is less than $\frac{2}{3}$ of a width of the reaction chamber and is less than $\frac{2}{3}$ of a distance from the substrate to the at least one perforation.

8. The method of claim 6, wherein the electrically conductive member has a curved and smooth surface.

9. The method of claim 8, wherein the electrically conductive member has a circular cross-sectional shape.

10. The method of claim 1, wherein the second gas comprises $SiH_4$.

11. The method of claim 1, wherein the second gas comprises at least one of $CF_4$ or $NF_3$.

12. A method of treating a surface of a substrate or depositing a layer of material on a substrate, comprising:
    injecting a first gas into a plasma chamber of a plasma reactor to generate radicals by plasma;
    injecting the generated radicals into a reaction chamber of the plasma reactor via at least one perforation between the reaction chamber and the plasma chamber;
    shielding the substrate from undesirable irradiation generated in the plasma chamber using a single electrically conductive rod placed between the at least one perforation and the substrate, the single electrically conductive rod having a curved and smoothed surface and configured to block straight linear paths between the plasma chamber and the substrate; and
    injecting the radicals to a portion of the substrate passing the reaction chamber.

13. The method of claim 12, further comprising moving the substrate to inject radicals to another portion of the substrate.

14. The method of claim 12, further comprising connecting the electrically conductive rod to ground.

15. The method of claim 12, further comprising applying a voltage signal across electrodes defining the plasma chamber.

16. The method of claim 12, further comprising conveying the first gas to the plasma chamber via a channel formed in the plasma reactor.

17. The method of claim 12, further comprising discharging excess radicals or gas via at least a passage formed between a side of the reaction chamber and an exhaust port formed in the plasma reactor.

18. The method of claim 17, wherein a distance from the substrate to a ceiling of the passage is less than ⅔ of a width of the reaction chamber and is less than ⅔ of a distance from the substrate to the at least one perforation.

19. The method of claim 17, wherein the electrically conductive rod has a circular cross-sectional shape.

* * * * *